United States Patent [19]

Shell et al.

[11] Patent Number: 5,429,956
[45] Date of Patent: Jul. 4, 1995

[54] METHOD FOR FABRICATING A FIELD EFFECT TRANSISTOR WITH A SELF-ALIGNED ANTI-PUNCHTHROUGH IMPLANT CHANNEL

[75] Inventors: Yau-Kae Shell; Gary Hong, Hsinchu, both of Taiwan

[73] Assignee: United Microelectronics Corporation, Hsinchu, Taiwan

[21] Appl. No.: 315,554

[22] Filed: Sep. 30, 1994

[51] Int. Cl.[6] .......................................... H01L 21/8234
[52] U.S. Cl. .......................................... 437/29; 437/26; 437/41; 437/44
[58] Field of Search ........................ 437/34, 41, 29, 26, 437/28, 913; 148/DIG. 117

[56] References Cited

U.S. PATENT DOCUMENTS

| | | | |
|---|---|---|---|
| 4,987,093 | 1/1991 | Teng et al. | 437/69 |
| 5,210,042 | 5/1993 | Oshikawa | 437/28 |
| 5,278,078 | 1/1994 | Kanebako et al. | 437/29 |
| 5,286,664 | 2/1994 | Horiuchi | 437/29 |
| 5,306,657 | 4/1994 | Yang | 437/29 |
| 5,308,777 | 5/1994 | Hong | 437/41 |
| 5,378,650 | 1/1995 | Kimura | 437/26 |

*Primary Examiner*—Brian E. Hearn
*Assistant Examiner*—Michael Trinh
*Attorney, Agent, or Firm*—George O. Saile

[57] ABSTRACT

A structure and method for fabricating a field effect transistor (FET) having improved drain to source punchthrough properties was achieved. The method utilizes the selective deposition of silicon oxide by a Liquid Phase Deposition (LPD) method to form a self-aligning implant mask. The mask is then used to implant a buried anti-punchthrough implant channel under and aligned to the gate electrode of the FET. The buried implant reduces the depletion width at the substrate to source and drain junction under the gate electrode but does not increase substantially the junction capacitance under the source and drain contacts, thereby improving punch-through characteristic while maintaining device performance.

24 Claims, 5 Drawing Sheets

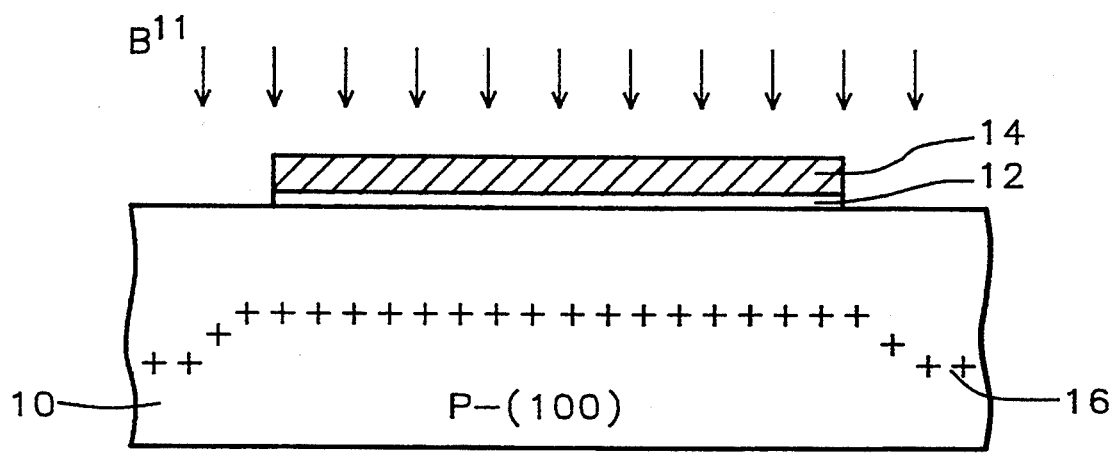
*FIG. 1 - Prior Art*
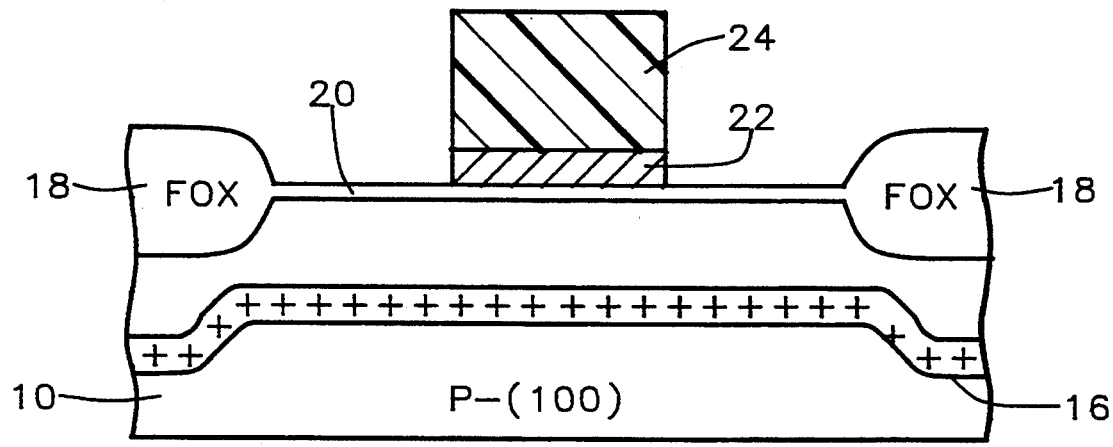
*FIG. 2 - Prior Art*

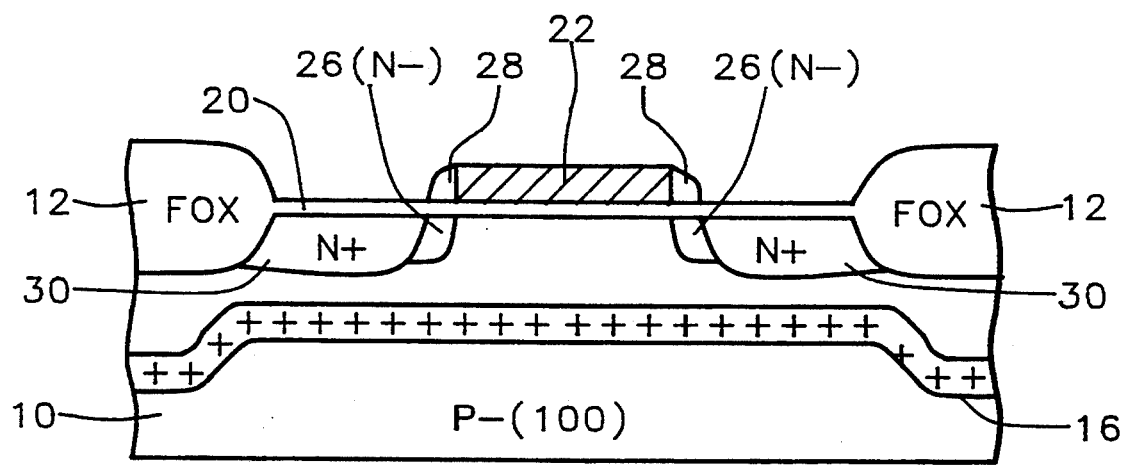
FIG. 3 - Prior Art
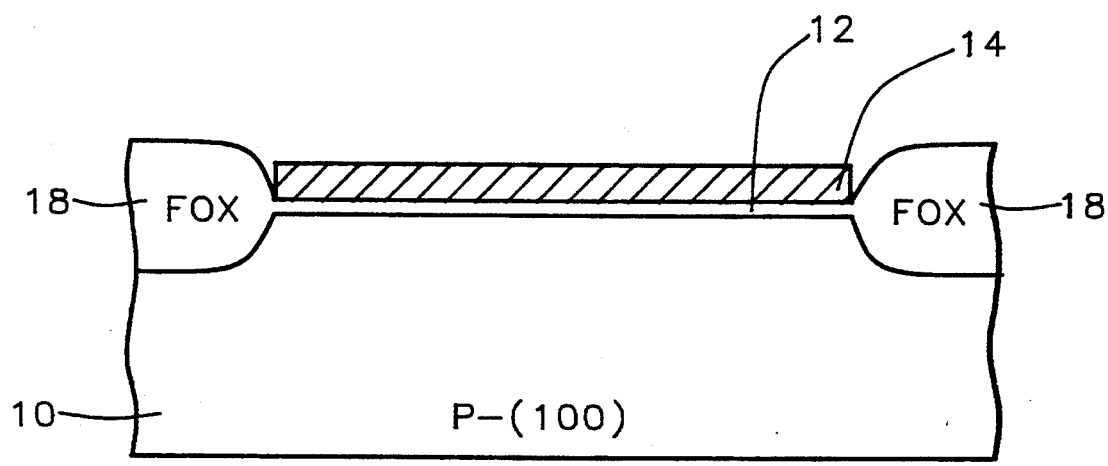
FIG. 4

METHOD FOR FABRICATING A FIELD EFFECT TRANSISTOR WITH A SELF-ALIGNED ANTI-PUNCHTHROUGH IMPLANT CHANNEL

BACKGROUND OF THE INVENTION (1) Field of the Invention

The present invention relates to the formation of integrated circuit devices on semiconductor substrates, and more particularly a method of fabricating a field effect transistor having a self-aligned anti-punchthrough implantation.

(2) Description of the Prior Art

In recent years advances in semiconductor processing technology as resulted in Ultra Large Scale Integration (ULSI) on the semiconductor substrate. For example, advances in high resolution photolithographic techniques and advances in plasma etching have resulted in feature sizes that are less than a half micrometer in size. One application of this down scaling on the semiconductor chip where the reduction in size dramatically improves performance of the circuit and increases device density on the chip is the formation of the gate electrode of the field effect transistor (FET). The reduced width of the gate electrode has resulted in channel lengths under the gate electrode becoming submicrometer in size.

Although the down scaling improves circuit density and performance, a number of short channel effects can occur that adversely affect device performance. For example, the major transistor phenomena that are affected by down scaling and degrade the transistor behavior include channel-length modulation, velocity saturation, mobility degradation, source/drain resistance, punchthrough, drain induced barrier lowering and dependence of threshold voltage ($V_t$) on device geometry.

When the channel length is reduced and is comparable in length to the source/drain junction depth, a considerable amount of the space charge, under the gate electrode, is linked to the source/drain junction depletion region. This results in less charge in the space-charge region being coupled or linked to the gate and the threshold voltage $V_t$ of the FET decreases. To minimize the threshold voltage $V_t$ variation with reduced channel length, it is common practice in the semiconductor industry to fabricate FET structures with Lightly Doped Drains (LDD). These LDD regions are formed adjacent to the gate electrode by doping using ion implantation. Sidewall insulating spacer on the gate electrode then mask the LDD region from further doping, while the heavier doped source/drain contacts are formed.

However, other short channel effects, such as punchthrough, still remain a serious problem. In this effect when the sum of the source and drain depletion widths formed in the substrate become greater than the channel length, the source and drain are electrically shorted together and the basic transistor action, as a switch is lost. Another short channel length effect that is closely related to the widening of the depletion width at the drain for a FET device that is turned-off, is Drain-Induced Barrier Lowering (DIBL) that occurs at the source end of the channel. This barrier lowering effect can result in increased leakage currents when the FET is in the off or non-conducting state. This can cause failure in dynamic circuits, and especially in DRAMs where charge retention is critical.

One method that is commonly practice in the semiconductor industry to prevent punchthrough is to form an anti-punchthrough buried implant channel in the substrate by ion implantation in the device area. This method is best understood by referring to the prior art as depicted in FIGS. 1 through 3. Starting with FIG. 1, a patterned silicon nitride/pad oxide stack is formed on the substrate 10 by photolithographic techniques and etching, leaving portions of the silicon nitride layer 14 and pad oxide layer 12 on the device areas and removing the stack layer elsewhere on the substrate where the Field OXide (FOX) isolation is to be formed. A deep anti-punchthrough buried channel 16 is formed in the substrate, for example, by implanting boron ions, such as isotope ($B^{11}$) and depicted in FIG. 1 by the down ward pointing arrows.

A conventional LOCOS (LOCal Oxidation of Silicon) method is then used to form the field oxide (FOX) structure. The method consisting of thermally oxidizing the substrate using the silicon nitride layer 14 as a barrier to oxidation over the device area. After forming the field oxide (FOX) structure 18, as shown in FIG. 2, the silicon nitride layer 16 and pad oxide 12 are removed and a good quality gate oxide layer 20 is thermally grown on the device area. The gate electrode 22 of the FET is then formed by depositing and patterning a polysilicon layer 22 using a patterned photoresist layer 24 and plasma etching.

As shown in FIG. 3, the photoresist is stripped and Lightly Doped Drain (LDD) source/drain regions 26 are formed by ion implantation of arsenic or phosphorus ions. The field effect transistor (FET) is then completed by forming sidewall spacers 28 over the LDD regions adjacent to the gate electrode and then forming the N+ doped source/drain contact 30.

Although the anti-punchthrough buried implant channel reduces punchthrough from drain to source, the increased junction capacitance resulting from the anti-punchthrough channel extending under the source/drain contact 30, degrades the circuit performance. Therefore, there is still a strong need in the semiconductor industry for improved methods of forming anti-punchthrough buried implant channels with reduced capacitance.

SUMMARY OF THE INVENTION

It is the principle object of this invention to provide a method for forming anti-punchthrough buried channels with reduced capacitance.

It is another object of this invention to provide this reduced capacitance by a method for self-aligning the anti-punchthrough channel to the FET channel.

It is still another object of the invention to formed this self-aligned anti-punchthrough buried channel by a technique of implanting the channel using a selectively deposited silicon oxide implant blockout mask formed by Liquid Phase Deposition (LPD).

In accordance with these objectives the invention provides a new field effect transistor structure having a buried anti-punchthrough implant region or channel aligned to and under the gate electrode of the FET. The invention also teaches a method for forming said improved FET structure by ion implantation using an implant blockout mask formed by selectively depositing a silicon oxide layer by Liquid Phase Deposition (LPD).

The method begins by providing a semi-conductor substrate, such as a P− doped single crystal silicon having a <100> crystallographic orientation. A thick field oxide (FOX) is then thermally grown by the conventional method of LOCOS (LOCal Oxidation of Silicon) to electrically isolate the device areas wherein the FETs are constructed.

A thin gate oxide layer is then formed on the device areas, such as by thermal oxidation in an oxygen containing ambient. A polysilicon layer is deposited on the substrate and then patterned by conventional photo-lithographic techniques and plasma etching to form the gate electrodes, of the FETs, over the gate oxide layer in the device area, and at the same time forming electrical interconnecting lines over the field oxide areas, such as the word lines for dynamic random access memory (DRAM).

With the photoresist is still in place on the gate electrode and interconnecting lines, a silicon oxide is selectively deposited by Liquid-Phase Deposition (LPD) over the field oxide areas and over the exposed portions of the gate oxide areas. However, the LPD oxide does not deposit on the photoresist. The deposition is achieved by immersing the substrate in a supersaturated solution of, for example, hydrofluosilicic acid ($H_2SiF_6$) made supersaturated by dissolving silicon oxide ($SiO_2$) powder therein. Although the detail mechanism is not well understood, it is believed that a dehydration reaction occurs at the silicon oxide surface making the selective adsorption of siloxane (Si—O—Si) oligomers on the oxide surfaces possible, thereby resulting in the selective deposition of $SiO_2$ on the oxide surface. A more detail description of the method for liquid-phase deposition of $SiO_2$ can be founds in the paper by T. Homma et al, entitled *"A Selective SiO2 Film-Formation Technology Using Liquid-Phase Deposition for Fully Planarized Multilevel Interconnections"* and published in the Journal of the Electrochemical Society, Vol. 140, No. 8, August 1993.

The LPD silicon oxide is grown to a thickness that is greater than the polysilicon layer from which the gate electrode is formed and of sufficient thickness to mask the high energy ion implant that will be later used to form the self-aligned anti-punchthrough buried channel of this invention. The patterned photoresist layer is now removed from over the patterned polysilicon layer, for example, by plasma ashing or wet stripping, and thereby forms a recess in the LPD silicon oxide layer that is self-aligned to the gate electrode of the FET. A sidewall spacer is formed on the sidewalls in the recessed LPD silicon oxide by depositing a silicon oxide, such as by Low Pressure Chemical Vapor Deposition (LPCVD) and then etching backing anisotropically. This further narrows the implant window in the LPD oxide and protects the edge of the gate electrode at the polysilicon/LPD oxide interface from implant damage.

The anti-punchthrough buried channel is now formed under and aligned to the polysilicon gate electrode by performing a high energy ion implantation in the LPD oxide window or recess, while the thick LPD oxide and CVD oxide sidewalls provide an mask to implant elsewhere on the substrate. The confinement of the anti-punchthrough channel under the gate electrode is effective at preventing drain to source punchthrough during operation of the circuit while substantially reducing junction capacitance under the source/drain contact area and thereby improving circuit performance.

The LPD silicon oxide is now removed from the substrate, such as by wet etching in a hydrofluoric acid solution, and then the FET devices are completed by forming the lightly doped drain (LDD), the sidewall spacers on the gate electrode and the source/drain contact implant.

BRIEF DESCRIPTION OF THE DRAWINGS

The object and other advantages of this invention are best explained in the preferred embodiment with reference to the attached drawings that include:

FIGS. 1 through 3, which is a schematic cross sectional view illustrating the process for a field effect transistor of the prior art having a conventional anti-punchthrough buried implant channel with a large junction capacitance.

FIGS. 4 through 9, which is a schematic cross sectional view illustrating the process and structure of this invention for a FET having an improved self-aligned anti-punchthrough implanted channel with a reduced junction capacitance.

DESCRIPTION OF THE PREFERRED EMBODIMENTS

Figure 5:
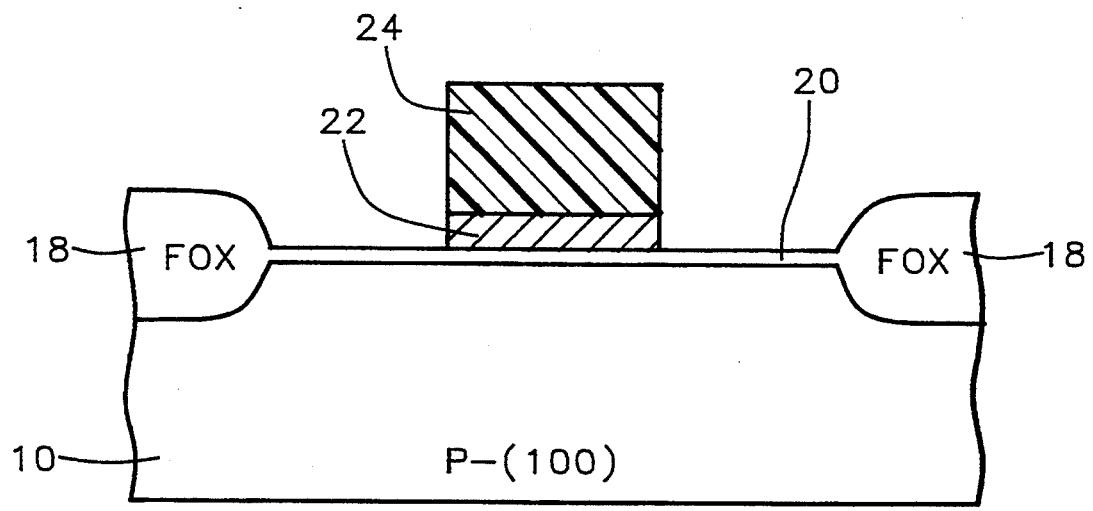

Referring now more particularly to FIGS. 4 through 9 there is shown an embodiment for fabricating a field effect transistor (FET) having the self-aligned anti-punchthrough buried implant channel. The new FET structure with improved punchthrough properties can be used to manufacture, for example, ULSI circuits such as DRAMs, SRAM, micro-processor circuits and the likes.

Referring now to FIG. 4, a cross sectional view of the starting substrate 10 is schematically shown. The preferred substrate is typically composed of a P-type single crystal silicon with a <100> crystallographic orientation. A thick Field OXide (FOX) structure is formed surrounding and electrically isolating the active device areas, wherein the field effect transistor (FET) devices having the improved self-aligned anti-punchthrough implant channel, of this invention, is to be built. The method commonly practiced in the industry for forming the Field OXide (FOX) consists of using a thin thermal oxide (pad oxide) layer 12 having a thickness of between about 300 to 500 Angstroms and a thicker silicon nitride layer 14, deposited, for example, by chemical vapor deposition (CVD), and having a thickness of between about 1000 to 2000 Angstroms, the silicon nitride layer 14 serving as a barrier mask to thermal oxidation. The required areas where the field oxide is required are etched open in the oxide/nitride layer using conventional photo-lithographic techniques and plasma etching and then a field oxide structure 18 is thermally grown, as shown in FIG. 4, typically to a thickness of about 4500 to 5500 angstroms.

The silicon nitride layer 14 is now removed from the device areas, for example, by wet etching in a heated solution of phosphoric acid ($H_3PO_4$), and the pad oxide is removed, for example, by etching in a buffered solution of hydrofluoric acid. The substrate 10 is then thermally oxidized to form the gate oxide layer 20 on the device area for the FET. The gate oxide 20 is typically between about 100 to 200 Angstroms thick.

Next, as shown in FIG. 5, the gate electrode structure 22, for the N-channel FET, is now formed by depositing a polysilicon layer 22, for example, by performing a low pressure chemical vapor deposition (LPCVD). The preferred thickness of layer 22 is usually in the range from between about 2000 to 4000 Angstroms. The polysilicon layer 20 is then made more electrically conducting by doping with N-type impurities, either by in situ doping during the LPCVD deposition or by depositing the polysilicon undoped and then ion implanting the dopant. Typically the N-type dopant species is arsenic or phosphorus having a concentration of between about 1 E 19 to 1 E 21 atoms/cm$^3$.

The polysilicon layer 22 is then coated with photoresist layer 24 and is patterned by photolithographic techniques to provide the etch mask layer over the polysilicon gate electrode and interconnecting conducting lines areas while exposing the polysilicon layer 22 elsewhere on the substrate. An anisotropic plasma etch, such as in a low pressure reactive ion etcher (RIE) containing a reactive etch gas mixture such as chlorine/argon or gas mixtures containing for example $CCL_2F_2$. After patterning the polysilicon layer 22 the patterned photoresist mask layer remains on the polysilicon gate electrode structure 22, as shown in FIG. 5., and provide an important function for the selective deposition of a silicon oxide layer 26 by Liquid Phase Deposition.

Figure 6:
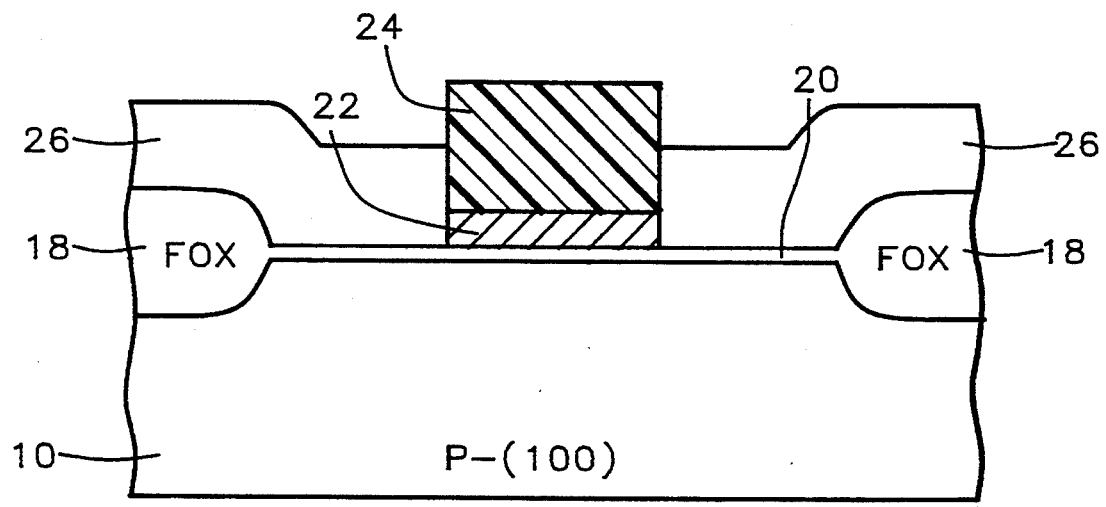

Now as shown in FIG. 6, the selective silicon oxide layer is deposited by Liquid Phase Deposition (LPD), by immersing the substrate in a supersaturated solution of, for example, hydrofluosilicic acid ($H_2SiF_6$) made supersaturated by dissolving silicon oxide ($SiO_2$) powder therein. Although the detail mechanism is not well understood, it is believed that a dehydration reaction occurs at the oxide surface making the adsorption of siloxane (Si—O—Si) oligomers possible, and thereby resulting in the selective deposition of $SiO_2$ on the silicon oxide surfaces while not depositing on the non-oxide surfaces, such as photoresist.

The LPD silicon oxide layer 26 is deposited by a timed deposition until the desired LPD silicon oxide thickness is achieved. Now as shown in FIG. 6, the LPD oxide layer is deposited having a thickness that substantially exceeds the thickness of the gate electrode, formed from the polysilicon layer 22. The preferred thickness of the LPD silicon oxide layer 26 is between about 3000 to 6000 Angstroms. The thickness of the LPD silicon oxide layer 26 is critical to the invention, because it must be sufficient thick to serve as an ion implant block out mask, at the later step in the process, when the anti-punchthrough implant channel is formed under the gate electrode 22 by a high energy ion implantation.

To continue the process, the photoresist layer 24 is now removed, for example, by plasma ashing in an oxygen ambient of by conventional photoresist stripping. This results in a recess in the LPD silicon oxide layer 26 which is over and aligned to the patterned polysilicon layer 24. Typically, the depth of the recess step in layer 26 to the top surface of the gate electrode 22 is between about 1500 to 4000 Angstroms.

Figure 7:
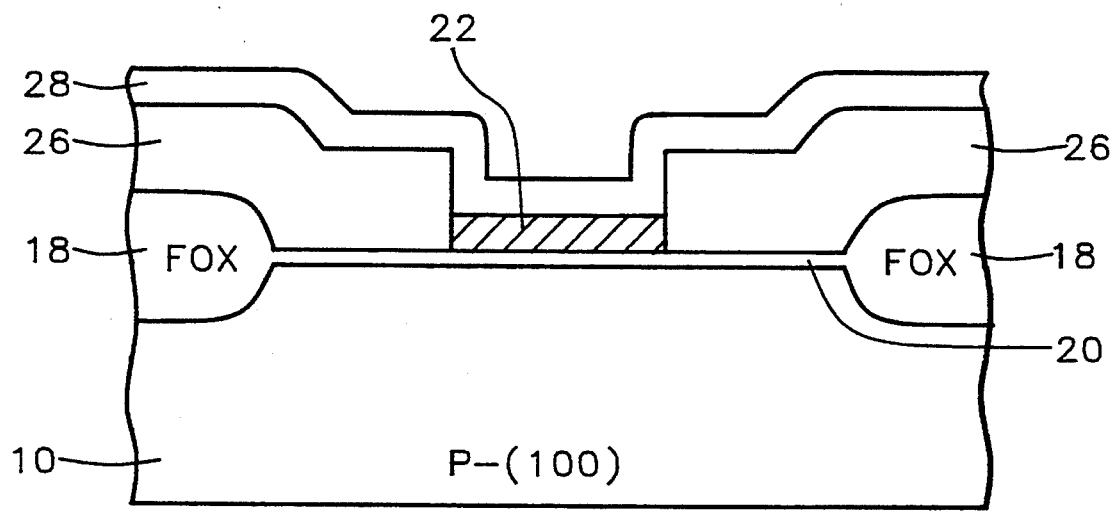
Figure 8:
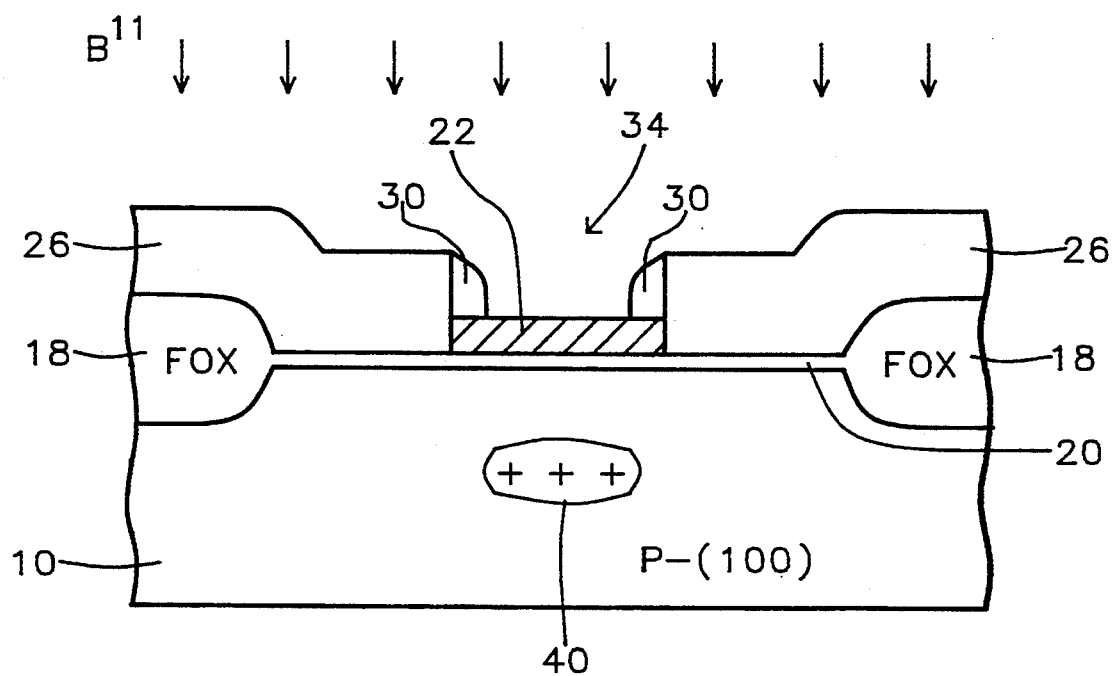

Referring now to FIG. 7, a first sidewall oxide layer 28 is deposited on the substrate forming a conformal layer over the recess steps in the LPD silicon oxide layer 26. The layer 28 is preferably a silicon oxide layer and having a thickness, preferably between about 500 to 7000 Angstroms. For example, the silicon oxide 26 can be formed by low pressure chemical vapor deposition using tetraethoxysilane (TEOS) at a temperature in the range of about 650° to 900° C. The sidewall oxide layer 28 is then etched back anisotropically to form sidewall spacer 30 on the sidewall of the recesses in the LPD oxide layer 26, as shown in FIG. 8. The etch back can be accomplished with a reactive plasma etcher of various design and using an appropriate gases mixture. For example, the etching can be performed in a gas mixture of carbon tetrafluoride and hydrogen ($CF_4/H_2$). Alternatively, a gas mixture containing trifluoromethane ($CHF_3$) can also be used.

The sidewalls 30 further narrows the self-aligned opening 34 over the gate electrode area that will be later used for implanting the buried anti-punchthrough implant channel in the substrate under the gate electrode 22. The sidewall spacer also protects the gate oxide 20 at the edge of the gate electrode 22 from implant damage that would otherwise degrade the reliability of the FET. The sidewall spacers also reduce the width of the anti-punchthrough implant channel, thereby further reducing the source and drain junction capacitance and improves circuit performance.

still referring to FIG. 8, the self-aligned anti-punchthrough implant channel 40 is now formed in the substrate 10 under the polysilicon gate electrode 22 by high energy ion implantation. The ion implant species for the N-channel FET formed in a P− substrate is of the same polarity as the substrate dopant and is preferably the boron isotope $B^{11}$. The preferred tilt angle, for the implant, is about 0 degrees, that is the implant is normal to the substrate surface. However, the implant parameters, such as the implant energy, should be tailor to the product process parameters, such as, the gate electrode thickness and the source/drain junction depths. However, by way of example only, if the thickness of the gate electrode is about 2000 Angstroms and the source/drain junction depth, after final processing is about 0.2 micrometers deep, then the preferred ion implant dose is between about 2 E 12 to 5 E 12 ion/cm$^2$ and the ion implant energy is between about 120 to 180 KeV. At these implant and process parameters, the projected ion range in the silicon substrate is then about 0.2 to 0.35 micrometers below the gate oxide layer 20.

After forming the anti-punchthrough channel implant, the implant blockout mask composed of the LPD silicon oxide layer 26 and the sidewall spacers 30 are removed from the substrate, for example by wet etching in a buffered hydrofluoric acid solution (BHF).

Figure 9:
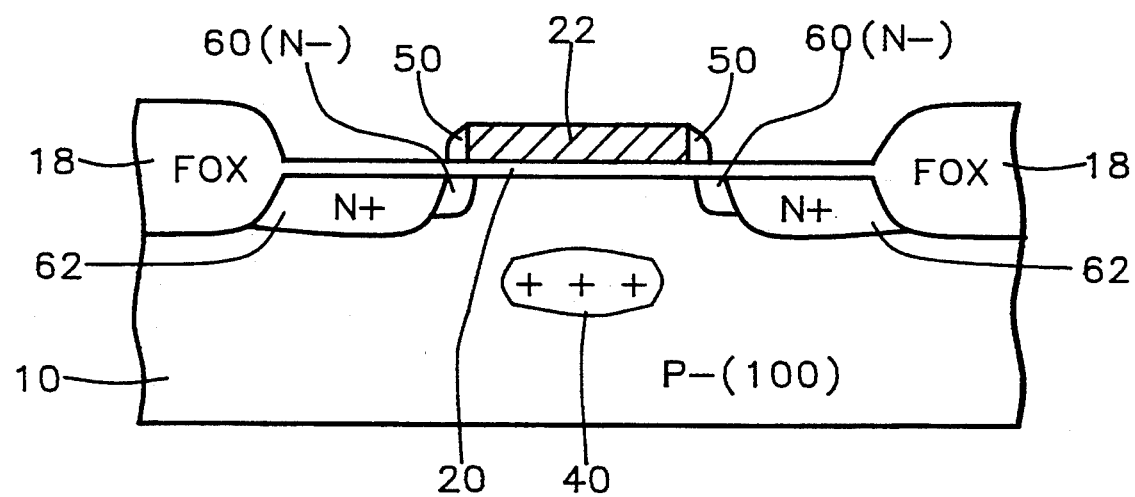

The FET is now completed, as shown in FIG. 9, by first forming a lightly doped source/drain region 60 in the device area, adjacent to the gate electrode 22. This doping is usually accomplished by implanting an N-type dopant species, such as arsenic or phosphorous, in the P-substrate device area. For example, a typical ion implantation for the LDD of the N-channel FET might consist of a phosphorous $p^{31}$ at a dose of between 1 to 10 E 13 atoms/cm$^2$ and with an energy of 30 to 80 Kev.

After forming the LDD areas, the sidewall spacers 50 are formed on the sidewall of the gate electrode structures 22. These spacers are formed by depositing a second sidewall oxide layer 50, for example, by LPCVD, and then using an anisotropic plasma etch to etch back to the source/drain surface, leaving portions of the silicon oxide layer 50 on the gate electrode sidewalls, and thereby forming the sidewall spacers 50, as shown in FIG. 9. The method for forming the sidewalls of the gate electrode is similar to the method used previously for forming the sidewalls spacers 30 on the sidewalls of the LPD oxide layer 26, and the process details are not here repeated. The FET source/drain contacts 62 are then formed by ion implantation to complete the N-channel FET having a self-aligned anti-punchthrough buried channel.

As is clearly seen in FIG. 9, the anti-punchthrough channel 40, of this invention, is essentially eliminate from under the source/drain areas and the junction capacitance associated therewith is substantially reduced.

While the invention has been particularly shown and described with reference to the preferred embodiments thereof, it will be understood by those skilled in the art that various changes in form and details may be made without departing from the spirit and scope of the invention. For example, self-aligned anti-punchthrough implant channels can be formed in N$^-$ doped substrates for P-channel FETs by simply reversing the dopant polarity. It is also possible to use additional photoresist blockout mask to form both types of anti-punchthrough implant channels on the same substrate having both P-channel and N-chennal devices, such as might be used for forming CMOS circuits.

What is claimed is:

1. A method for fabricating a field effect transistor having a self-aligned anti-punchthrough buried implant channel, comprising the steps of:
   providing a semiconductor substrate having a principle surface with device areas and field oxide areas formed thereon;
   forming a gate oxide on said device areas by thermal oxidation;
   depositing a polysilicon layer on said device areas and elsewhere on said semiconductor substrate;
   patterning said polysilicon layer using a patterned photoresist mask and anisotropic etching, and thereby forming gate electrodes on said gate oxide;
   depositing selectively by liquid phase deposition (LPD) a LPD silicon oxide layer on said exposed field oxide areas and said exposed gate oxide layers and leaving free from deposit said patterned photoresist mask on said patterned polysilicon layer, said LPD silicon oxide layer being thicker than said polysilicon layer;
   removing said patterned photoresist mask and thereby forming recesses in said LPD silicon oxide layer aligned to said patterned polysilicon layer;
   depositing a first sidewall oxide layer on said substrate;
   blanket etching back anisotropically said first sidewall oxide layer, and thereby forming sidewall spacers on sidewalls of said LPD silicon oxide layer in said recesses;
   implanting by ion implantation through said polysilicon layer and said gate oxide layer into said substrate, and thereby forming a buried anti-punchthrough implant channel below and aligned to said gate electrodes, and said LPD silicon oxide layer masking said implant elsewhere on said substrate;
   removing said LPD silicon oxide layer and said first sidewall oxide layer;
   implanting by ion implantation said exposed device areas and forming lightly doped drain (LDD) regions adjacent to said gate electrodes;
   depositing a second sidewall oxide layer on said substrate;
   blanket etching back anisotropically said second sidewall oxide layer and thereby forming sidewall spacer on sidewalls of said gate electrodes;
   implanting by ion implantation and forming source and drain contacts in said device areas, and thereby completing said field effect transistors having buried anti-punchthrough implant channels under and aligned to said gate electrodes.

2. The method of claim 1, wherein a thickness of said polysilicon layer is between about 2000 to 4000 Angstroms and is doped with N type dopant atoms having a concentration of between about 1 E 19 to 1 E 21 atoms/cm$^3$.

3. The method of claim 1, wherein a thickness of said photoresist mask is between about 10000 to 20000 Angstroms.

4. The method of claim 1, wherein a thickness of said selectively deposited silicon oxide layer by liquid phase deposition (LPD) is between about 3000 to 6000 Angstroms.

5. The method of claim 1, wherein said liquid phase deposition is performed in a supersaturated aqueous solution of hydrofluorsilicic acid ($H_2SiF_6$) and boric acid ($H_3BO_3$) acid at a temperature of about 35° C.

6. The method of claim 5, wherein said aqueous solution of boric acid is added continuously to said hydrofluorsilicic acid ($H_2SiF_6$) to maintain a supersaturated solution.

7. The method of claim 1, wherein said first sidewall oxide is silicon oxide deposited by low pressure chemical vapor deposition having a thickness of between about 500 to 2000 Angstroms.

8. The method of claim 1, wherein the ion of said ion implantation through said polysilicon layer and said gate oxide layer are boron ($B^{11}$) having an implant dose of between about 1 E 12 to 1 E 13 ions/cm$^2$ and having an implant energy of between about 120 to 180 KeV.

9. The method of claim 8, wherein said ion are implanted having a zero degree tilt angle (normal to said substrate).

10. The method of claim 1, wherein the removal of said LPD silicon oxide layer and said first sidewall oxide layer is in a buffered hydrofluoric acid solution.

11. The method of claim 1, wherein said lightly doped drain (LDD) are formed by implantation of phosphorus (P31) ion having a dose of between about 1 E 13 to 1 E 14 ions/cm$^2$ and an implant energy of between about 30 to 80 KeV.

12. The method of claim 1, wherein said source and drain contacts are formed by implantation of arsenic (As) ion having a dose of between about 1 E 15 to 1 E 16 ions/cm$^2$ and an implant energy of between about 30 to 100 KeV.

13. A method for fabricating a field effect transistor having a self-aligned anti-punchthrough buried channel implant, comprising the steps of:
   providing a semiconductor substrate having a principle surface with device areas and field oxide areas formed thereon;
   forming a gate oxide on said device areas by thermal oxidation;
   depositing a polysilicon layer on said device areas and elsewhere on said semiconductor substrate;
   patterning said polysilicon layer using a patterned photoresist mask and anisotropic etching, and thereby forming gate electrodes on said gate oxide;
   depositing selectively by liquid phase deposition (LPD) in a solution of hydrofluorsilicic acid and boric acid a LPD silicon oxide layer on said exposed field oxide and said exposed gate oxide layers and leaving free of said deposition said patterned photoresist mask on said patterned polysilicon layer, said LPD silicon oxide layer being thicker than said polysilicon layer;

removing said patterned photoresist mask, and thereby forming recesses in said LPD silicon oxide layer aligned to said patterned polysilicon layer;

depositing a first sidewall oxide layer on said substrate;

blanket etching back anisotropically said first sidewall oxide layer, and thereby forming sidewall spacers on sidewall of said LPD silicon oxide layer recesses;

implanting boron ion ($B^{11+}$) by ion implantation through said polysilicon layer and said gate oxide layer into said substrate, and thereby forming a buried anti-punchthrough implant channel below and aligned to said gate electrodes, and said LPD silicon oxide layer masking said implant elsewhere on said substrate;

removing said LPD silicon oxide layer and said first sidewall oxide layer;

implanting by ion implantation said exposed device areas and forming lightly doped drain (LDD) regions adjacent to said gate electrodes;

depositing a second sidewall oxide layer on said substrate;

blanket etching back anisotropically said second sidewall oxide layer and thereby forming sidewall spacers on sidewalls of said gate electrodes;

implanting by ion implantation and forming source and drain contacts in said device areas, and thereby completing said field effect transistors having buried anti-punchthrough implant channels under and aligned to said gate electrodes.

14. The method of claim 13, wherein a thickness of said polysilicon layer is between about 2000 to 4000 Angstroms and is doped with N type dopant atoms having a concentration of between about 1 E 19 to 1 E 21 atoms/cm$^3$.

15. The method of claim 13, wherein a thickness of said photoresist mask is between about 10000 to 20000 Angstroms.

16. The method of claim 13, wherein a thickness of said selectively deposited silicon oxide layer by liquid phase deposition (LPD) is between about 3000 to 6000 Angstroms.

17. The method of claim 13, wherein said liquid phase deposition is performed in a supersaturated aqueous solution of hydrofluorsilicic acid ($H_2SiF_6$) and boric acid ($H_3BO_3$) acid at a temperature of about 35° C.

18. The method of claim 17, wherein said aqueous solution of boric acid is added continuously to said hydrofluorsilicic acid ($H_2SiF_6$) to maintain a supersaturated solution.

19. The method of claim 13, wherein said first sidewall oxide is silicon oxide deposited by low pressure chemical vapor deposition having a thickness of between about 500 to 2000 Angstroms.

20. The method of claim 13, wherein the ions of said ion implantation through said polysilicon layer and said gate oxide layer are boron ($B^{11}$) having an implant dose of between about 1 E 12 to 1 E 13 ions/cm$^2$ and having an implant energy of between about 120 to 180 KeV.

21. The method of claim 20, wherein said ions are implanted having a zero tilt angle (normal to said substrate).

22. The method of claim 13, wherein the removal of said LPD silicon oxide layer and said first sidewall oxide layer is in a buffered hydrofluoric acid solution.

23. The method of claim 13, wherein said lightly doped drain (LDD) are formed by implantation of phosphorus ($p^{31}$) ion having a dose of between about 1 E 13 to 1 E 14 ions/cm$^2$ and an implant energy of between about 30 to 80 KeV.

24. The method of claim 13, wherein said source and drain contacts are formed by implantation of arsenic (As) ions having a dose of between about 1 E 15 to 1 E 16 ions/cm$^2$ and having an implant energy of between about 30 to 100 KeV.

* * * * *